(12) United States Patent
Choi et al.

(10) Patent No.: US 7,603,535 B2
(45) Date of Patent: Oct. 13, 2009

(54) LOW POWER CONSUMPTION SEMICONDUCTOR MEMORY DEVICE CAPABLE OF SELECTIVELY CHANGING INPUT/OUTPUT DATA WIDTH AND DATA INPUT/OUTPUT METHOD

(75) Inventors: Jung-hwan Choi, Gyeonggi-do (KR); Chan-kyung Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 675 days.

(21) Appl. No.: 10/959,114

(22) Filed: Oct. 7, 2004

(65) Prior Publication Data
US 2005/0078535 A1  Apr. 14, 2005

(30) Foreign Application Priority Data
Oct. 9, 2003  (KR) .................... 10-2003-0070283

(51) Int. Cl.
*G06F 13/20* (2006.01)
(52) U.S. Cl. .................. 711/169; 711/100; 711/151; 711/154
(58) Field of Classification Search ................ 711/169, 711/100, 151, 154
See application file for complete search history.

(56) References Cited

U.S. PATENT DOCUMENTS 5,923,615 A      7/1999  Leach et al.
2003/0214854 A1*  11/2003  Imondi et al. ............... 365/200

* cited by examiner

*Primary Examiner*—Tuan V Thai
*Assistant Examiner*—Yong Choe
(74) *Attorney, Agent, or Firm*—Volentine & Whitt, PLLC

(57) ABSTRACT

A semiconductor memory device includes a memory cell core having a plurality of memory cells; a data input/output circuit unit, which sets an input/output data width in response to input/output control signals and inputs/outputs data signals through at least some of a plurality of input/output pads; a pipelined circuit unit, which is connected to the data input/output circuit unit through input/output lines and transmits the data signals between the memory cell core and the data input/output circuit unit in synchronization with predetermined clock signals through an input/output path selected in response to pipeline enable signals; and a plurality of selection units, which are connected to the input/output lines through external common data lines and connect some of the input/output lines to the data input/output circuit unit in response to selection control signals. The semiconductor memory device and the data input/output method enable selective changes to the input/output data width, as needed, and selectively operate a pipelined circuit based on a set input/output data width.

20 Claims, 6 Drawing Sheets

LOW POWER CONSUMPTION SEMICONDUCTOR MEMORY DEVICE CAPABLE OF SELECTIVELY CHANGING INPUT/OUTPUT DATA WIDTH AND DATA INPUT/OUTPUT METHOD

CROSS REFERENCES TO RELATED APPLICATIONS

This application claims the priority of Korean Patent Application No. 2003-70283, filed on Oct. 9, 2003, the contents of which are hereby incorporated by reference in their entirety as if fully set forth herein.

BACKGROUND AND SUMMARY

1. Technical Field

The present invention relates to a semiconductor memory device, and more particularly, a synchronous semiconductor memory device.

2. Description of the Related Art

In general, a memory device such as a synchronous DRAM, for reading and writing data in synchronization with a clock signal utilizes burst read and write schemes. The burst read scheme is a high-speed data reading method where data corresponding to the number of bursts for a single enabled address is output in response to consecutive clock signals. More specifically, in the burst read scheme, a column selection signal for a column is enabled in response to a clock signal, and data is read. Next, the column signal is disabled in response to a next clock signal, and a next column selection signal is enabled. The data is read by repeating these operations.

The memory device utilizing the burst read and write schemes generally comprises pipelined circuits. During a read operation, each of the pipelined circuits stores data read from a plurality of memory cells and outputs the data to the exterior through an output driver in synchronization with a predetermined clock signal. In addition, during a write operation, each of the pipelined circuits stores a large amount of write data received from the exterior though an input driver, and transmits the data to the memory cells in synchronization with the clock signal.

The semiconductor memory device with the pipelined circuits can perform the read and write operations on a plurality of memory cells in one time. An example of the semiconductor memory device with the pipelined circuits is disclosed in U.S. Pat. No. 5,923,615.

On the other hand, as the input/output speed of the DRAM is getting higher, memory systems having a point-to-point bus architecture are widely used. However, it is difficult to connect a large number of devices to the memory systems having the point-to-point bus architecture. For example, in a memory system having a 64 bit bus width, if four memory devices having an input/output data width of ×16 are connected to the memory system, the 64 bit bus width is completely filled. Therefore, an additional memory device is no longer connected to the memory system.

In a conventional semiconductor memory device, an input/output data width is fixed. In other words, the conventional semiconductor memory device has a single specified input/output data width. For example, a memory device having an input/output data width of ×16 comprises 16 pipelined circuits. The memory device further comprises 16 output drivers and 16 input receivers which are connected to the 16 pipelined circuits. FIG. 1 illustrates a semiconductor memory device having an input/output data width of ×16.

Referring to FIG. 1, a semiconductor memory device 10 comprises a memory cell core 11, a pipelined circuit 12, an input/output circuit 13, and a control unit 14. The semiconductor memory device 10 simultaneously outputs or receives 16 bits of read/write data through 16 pads P1~P16.

However, since its input/output data width is fixed, the conventional semiconductor memory device has a limitation in use for the aforementioned memory system which it is difficult for a large number of devices to connect, for example, a memory system having a point-to-point architecture.

In order to solve the problem, a semiconductor memory device having a fuse circuit used to change an input/output data width is proposed. The fuse circuit is connected between a pipelined circuit and a line for a control signal. The pipelined circuit is enabled in response to the control signal. After the fuse circuit is cut, the control signal cannot be received, and the corresponding pipelined circuit no longer operates. In the conventional memory device having such a fuse circuit, the input/output data width of the memory device can be changed only once.

For example, a semiconductor memory device having a maximum input/output data width of ×16 comprises 16 pipelined circuits, 16 output drivers and 16 input receivers connected thereto. When fuse circuits connected to eight of the 16 pipelined circuits are cut, the input/output data width of the semiconductor memory device changes into ×8. As a result, only the eight pipelined circuits connected to the remaining uncut fuses can operate.

In the conventional semiconductor memory device, since only specified pipelined circuits and their corresponding input/output circuits operate, there is a limitation of increasing data input/output speeds.

Accordingly, it would be desirable to provide a low power consumption semiconductor device capable of selectively changing an input/output data width, as needed, and selectively operating a pipelined circuit based on a set input/output data width.

It would also be desirable to provide a low power consumption semiconductor device capable of selectively operating an input/output circuit based on a set input/output data width.

It would further be desirable to provide a data input/output method in a semiconductor memory device capable of selectively changing an input/output data width, as needed, and selectively operating a pipelined circuit based on a set input/output data width.

It would still further be desirable to provide a data input/output method in a semiconductor memory device capable of selectively operating an input/output circuit based on a set input/output data width.

According to an aspect of the present invention, a synchronous semiconductor memory device comprises a memory cell core, data input/output circuit unit, a pipelined circuit unit, and a plurality of selection units. The memory cell core has a plurality of memory cells. The data input/output circuit unit sets an input/output data width in response to input/output control signals and inputs/outputs data signals through all or some of a plurality of input/output pads. The pipelined circuit unit is connected to the data input/output circuit unit through input/output lines and transmits the data signals between the memory cell core and the data input/output circuit unit in synchronization with a predetermined clock signal through an input/output path selected in response to pipeline enable signals. The plurality of selection units are connected to the input/output lines through external common data lines and connect some of the input/output lines to the data input/output circuit unit in response to selection control signals.

According to another aspect of the present invention, a memory device, comprises: a memory cell core adapted to store data; a plurality of input/output connections adapted to communicate the data to and from the memory device; a pipelined circuit unit adapted to communicate the data to/from the memory cell core in response to pipeline enable signals; and a plurality of selection units each adapted to selectively communicate the data between the pipelined circuit unit and selected ones of the plurality of input/output connections in response to selection control signals, wherein a number of the selected ones of the plurality of input/output connections equals an input/output data width of the memory device.

According to still another aspect of the present invention, a method of inputting/outputting data for a synchronous semiconductor memory device having a memory cell core, a plurality of pipelined circuits and a plurality of selection units, the method comprises (a) setting an input/output data width; (b) enabling at least some of a plurality of input/output circuits based on the set input/output data width; (c) when all of the input/output circuits are enabled, (i) enabling all pipelined circuits and disabling all selection units, and (ii) inputting/outputting data through the enabled pipelined circuits and input/output circuits; and (d) when less than all of the input/output circuits are enabled, (i) enabling at least one of a plurality of selection units having a number of output signals corresponding to the input/output data width, and disabling other selection units; (ii) enabling a same number of the pipelined circuits as enabled input/output circuits, based on a column address signal; and (iii) inputting/outputting data through the enabled pipelined circuits, the at least one enabled selection unit, and the enabled input/output circuits.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
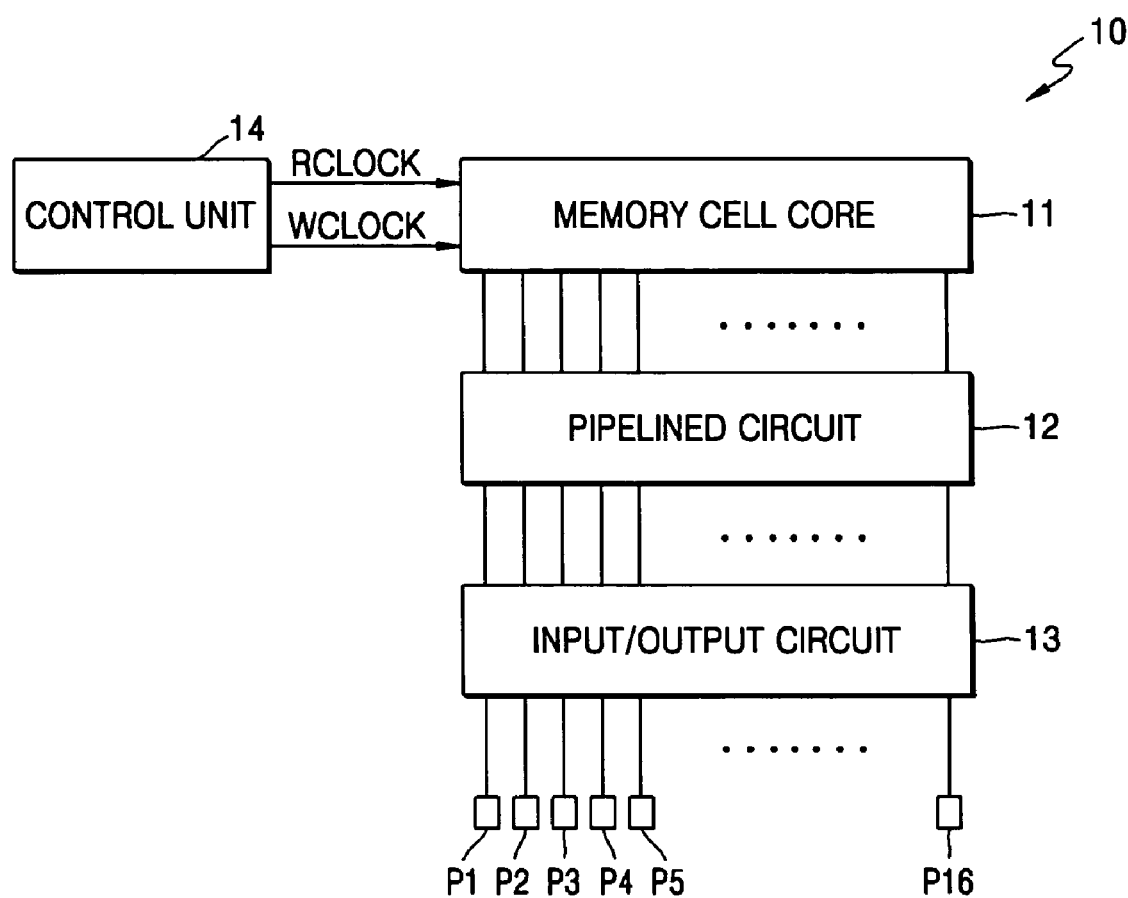
FIG. 1 is a view illustrating a semiconductor memory device in the prior art.

The attached drawings for illustrating exemplary embodiments of the present invention are referred to in order to gain a sufficient understanding of the present invention, the merits thereof, and the objectives accomplished by the implementation of the present invention.

Hereinafter, the present invention will be described in detail by explaining exemplary embodiments of the invention with reference to the attached drawings. Like reference numerals in the drawings denote like elements.

Figure 2:
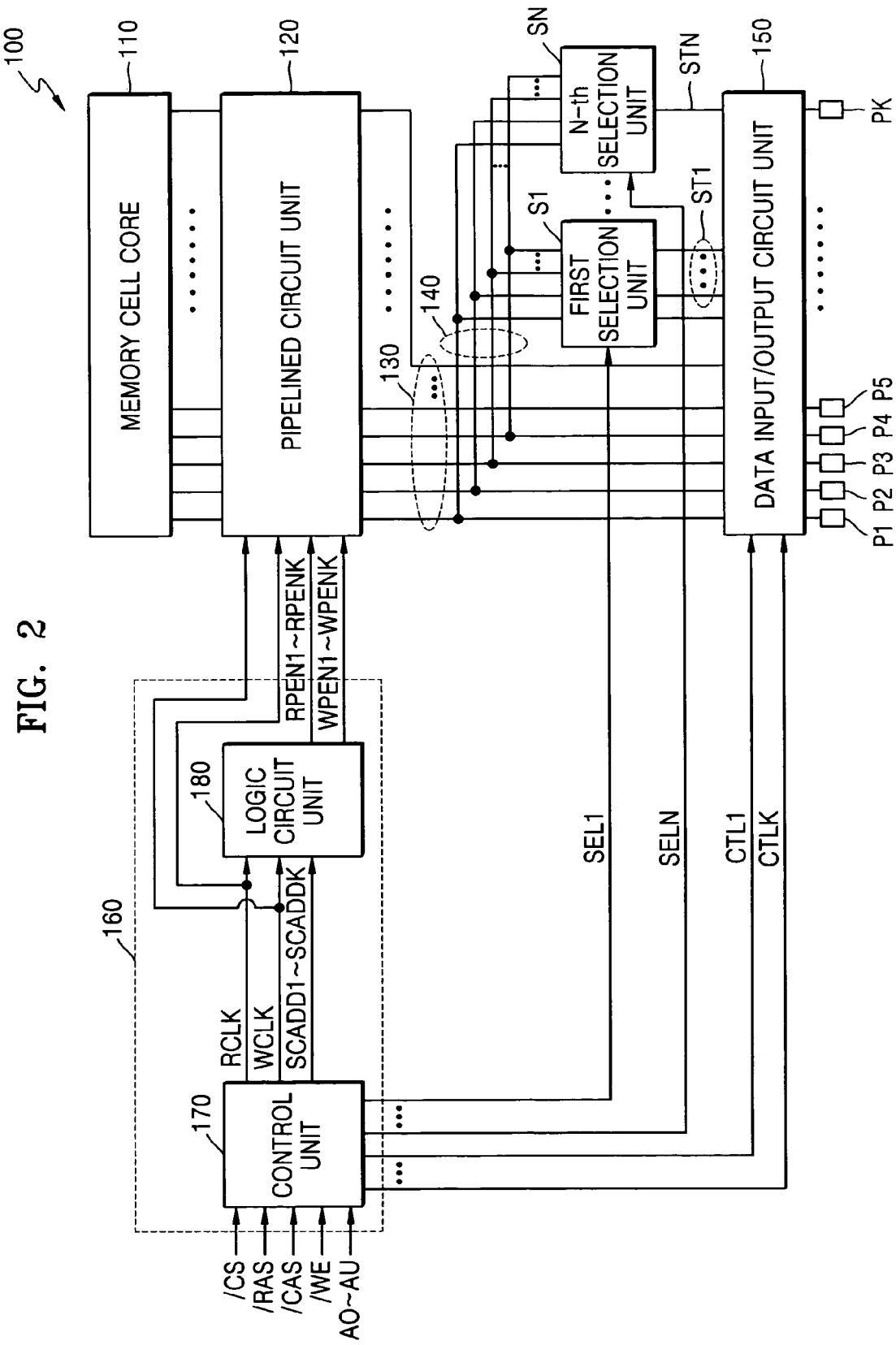
FIG. 2 is a view illustrating an embodiment of a semiconductor memory device according to one or more aspects of the present invention.

FIG. 2 is a view illustrating a semiconductor memory device.

The semiconductor memory device 100 comprises a memory cell core 110, a pipelined circuit unit 120, first to N-th selection units S1~SN (N is a natural number of 2 or more), a data input/output circuit unit 150, and a control signal generation unit 160.

The memory cell core 110 comprises a plurality of memory cells (not shown). The pipelined circuit unit 120 selects input/output paths in response to read pipeline enable signals RPEN1~RPENK (K is a natural number of 2 or more) and write pipeline enable signals WPEN1~WPENK. In response to a read clock signal RCLK or a write clock signal WCLK, the pipelined circuit unit 120 transmits read or write data signals through the selected input/output paths between the memory cell core 110 and the data input/output circuit unit 150.

The first to N-th selection units S1~SN are connected to input/output lines 130 of the pipelined circuit unit 120 through external common data lines 140. The first to N-th selection units S1~SN have different numbers of output lines ST1~STN. The number of the output lines, ST1~STN, of the first to N-th selection units S1~SN gradually decreases from first selection unit S1 to the N-th selection unit SN. In response to predetermined selection control signals SEL1~SELN, one of the first to N-th selection units S1~SN is enabled.

The numbers of the output lines ST1~STN of the first to N-th selection units S1~SN correspond to available input/output data widths of semiconductor memory device 100. More specifically, assume that the semiconductor memory device 100 comprises the first to fourth selection units S1~S4 and the numbers of the output lines of the first to fourth selection units S1~S4 are 8, 4, 2, and 1, respectively. When the input/output width of semiconductor memory device 100 is set to one of ×8, ×4, ×2, and ×1, one of the first to fourth selection units S1~S4 is enabled.

The data input/output circuit unit 150 is connected to the input/output lines 130 and the output lines ST1~STN of the first to N-th selection units S1~SN. In response to predetermined input/output control signals CTL1~CTLK, an input/output data width is set to the data input/output circuit unit 150. The data input/output circuit unit 150 outputs the read data signals or receives the write data signals through some or all of a plurality of input/output connections (e.g., input/output pads P1~PK) in accordance with the input/output data width.

As a result, a selection unit having the number of output signals corresponding to the input/output data width, which is set to the data input/output circuit unit 150, is enabled.

For example, in a case where a maximum input/output data width of data input/output circuit unit 150 is ×16, if the input/output data width of data input/output circuit unit 150 is set to ×8, the control signal generation unit 160 outputs the selection control signals SEL1~SELN, so that a selection unit having 8 output lines out of the first to N-th selection units S1~SN can be enabled, and the other selection units are disabled. The data input/output circuit unit 150 is connected to the input/output lines 130 through the enabled selection unit. In this case, the data input/output circuit unit 150 receives/transmits the read and write data signals from/to the pipelined circuit unit 120 through the enabled selection unit and the input/output lines 130

If the input/output data width of data input/output circuit unit 150 is set to ×16, that is, the maximum input/output data width, the control signal generation unit 160 outputs the selection control signals SEL1~SELN, so that all of the first to N-th selection units S1~SN can be disabled. In this case, the data input/output circuit unit 150 receives/transmits the read and write data signals from/to the pipelined circuit unit 120 through the input/output lines 130.

The control signal generation unit 160 comprises a control unit 170 and a logic circuit unit 180. In response to external control signals /CS, /RAS, /CAS, /WE and address signals A0~AU (U is a natural number of 2 or more), the control unit 170 outputs the selection control signals SEL1~SELN, the input/output control signals CTL1~CTLK, the read clock signal RCLK, the write clock signal WCLK, and sub-column address signals SCADD1~SCADDK. Although not shown in FIG. 2, the control unit 170 may comprise a command decoder and a control register. A value of the input/output width of semiconductor memory device 100 is set to the control register. The control register outputs the selection control signals SEL1~SELN and the input/output control signals CTL1~CTLK in accordance with the set value of the input/output data width.

In response to the external control signals /CS, /RAS, /CAS, /WE, the command decoder generates a write command signal and the write clock signal WCLK, or a read command signal and the read clock signal RCLK. In addition, in response to external column address signals (not shown) received during a write or read operation, the command decoder outputs the sub-column address signals SCADD1~SCADDK.

In response to the read clock signal RCLK and the sub-column address signals SCADD1~SCADDK, the logic circuit unit 180 outputs the read pipeline enable signals RPEN1~RPENK. In addition, in response to the write clock signal WCLK and the sub-column address signals SCADD1~SCADDK, the logic circuit unit 180 outputs the write pipeline enable signals WPEN1~WPENK.

Now, embodiments of the pipelined circuit unit 120, the first to N-th selection units S1~SN, the data input/output circuit unit 150, and the logic circuit unit 180 will be described in detail with reference to FIG. 3.

Figure 3:
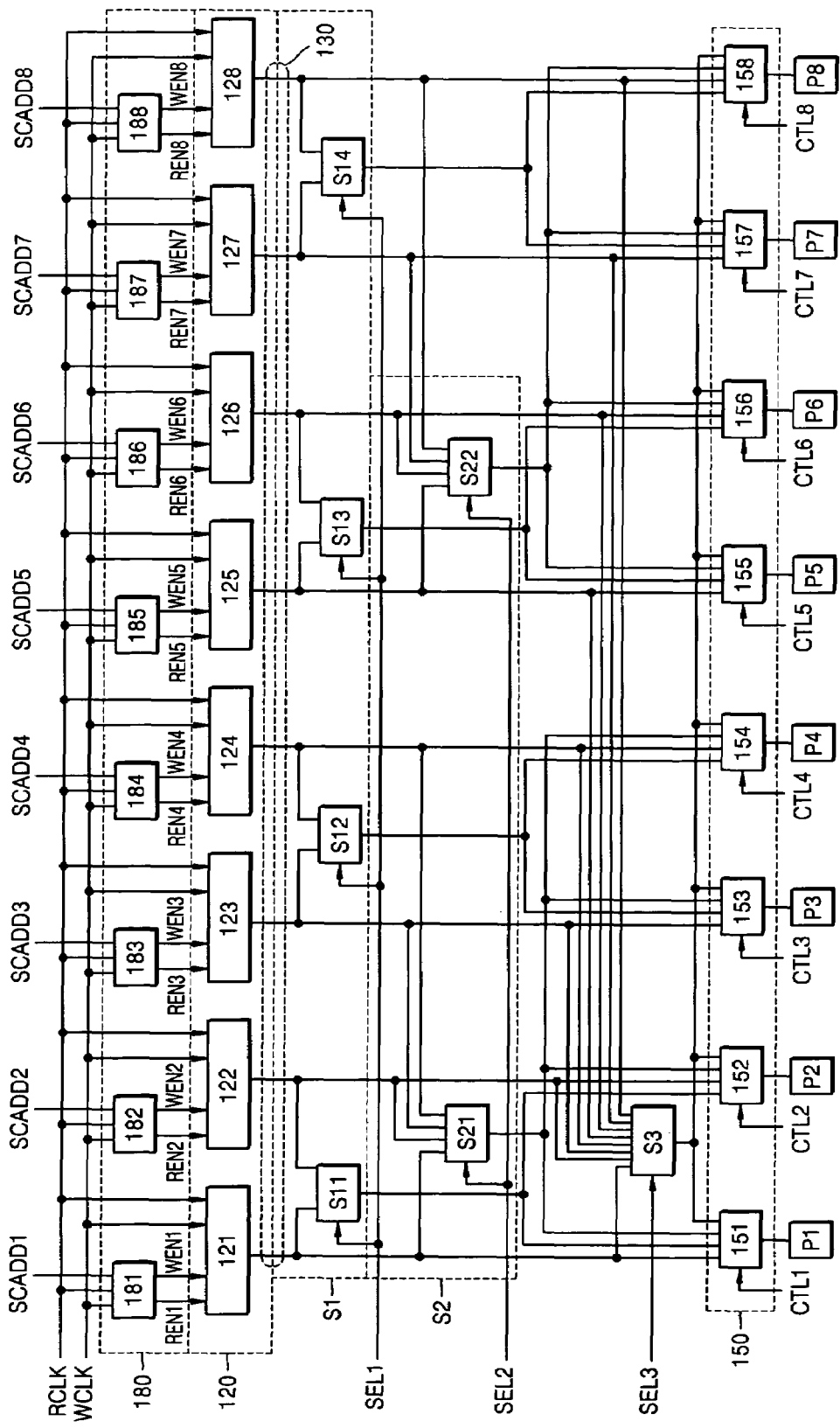
FIG. 3 is a view illustrating an example of a logic circuit unit, a pipelined circuit unit, first to N-th selection units, and a data input/output circuit unit illustrated in FIG. 2.

FIG. 3 illustrates an example where the semiconductor memory device 100 having a maximum input/output data width of ×8 comprises first to third selection units S1~S3. The logic circuit unit 180 comprises a plurality of logical circuits 181~188, and the pipelined circuit unit 120 comprises a plurality of pipelined circuits 121~128. In addition, the data input/output circuit unit 150 comprises a plurality of input/output circuits 151~158. Although not shown in FIG. 3, each of the input/output circuits 151~158 comprises an output driver and an input receiver. For simplification of FIG. 3, data lines of the pipelined circuit unit 120 connected to the memory cell core (see 110 of FIG. 1) are omitted.

In response to the read clock signal RCLK and the sub-column address signals SCADD1~SCADD8, the plurality of logical circuits 181~188 output read pipeline enable signals REN1~REN8. In addition, in response to the write clock signal WCLK and the sub-column address signals SCADD1~SCADD8, the plurality of logical circuits 181~188 output write pipeline enable signals WEN1~WEN8.

In response to the read pipeline enable signals REN1~REN8 or the write pipeline enable signals WEN1~WEN8, the plurality of pipelined circuits 121~128 are enabled or disabled. When enabled in response to the read pipeline enable signals REN1~REN8, the plurality of pipelined circuits 121~128 store read data signals received from the memory cell core 110. Next, in response to the read clock signal RCLK, the plurality of pipelined circuits 121~128 output the read data signals to input/output lines 130.

In addition, when enabled in response to the write pipeline enable signals WEN1~WEN8, the plurality of pipelined circuits 121~128 store write data signals received through the input/output lines 130. Next, in response to the write clock signal WCLK, the plurality of pipelined circuits 121~128 output the write data signals to the memory cell core 110.

Each of the pipelined circuits 121~128 is connected to the corresponding one of the input/output circuits 151~158 though the input/output lines 130. For example, the pipelined circuit 121 is connected to the corresponding input/output circuit 151.

In addition, the first to third selection units S1~S3 are connected to the input/output lines 130. For simplification of FIG. 3, reference numerals of the external common data lines (see 140 of FIG. 2) are omitted, and connection between the input/output lines 130 and the first to third selection units S1~S3 is schematically illustrated. Output lines of the first to third selection units S1~S3 are connected to the plurality of input/output circuits 151~158.

In addition, the first to third selection units S1~S3 comprise different numbers of selection circuits. More specifically, the first selection unit S1 comprises selection circuits S11~S14, the second selection unit S2 comprises selection circuits S21~S22, and the third selection unit S3 comprises only a single selection circuit.

In response to the selection control signal SEL1, each of the selection circuits S11~S14 connects an input/output line of one of two pipelined circuits to two input/output circuits. For example, in response to the selection control signal SEL1, the selection circuit S11 connects an input/output line of one of the pipelined circuits 121 and 122 to the input/output circuits 151 and 152. When the selection circuit S11 is enabled, one of the input/output circuits 151 and 152 is enabled. As a result, even though the selection circuit S11 connects the input/output line of one of the pipelined circuits 121 and 122 to both of the input/output circuits 151 and 152, the read or write data signal can be input/output through the enabled one of the input/output circuits 151 and 152.

In response to the selection control signal SEL2, each of the selection circuits S21~S22 connects an input/output line of one of four pipelined circuits to four input/output circuits. For example, in response to the selection control signal SEL2, the selection circuit S21 connects an input/output line of one of the pipelined circuits 121~124 to the input/output circuits 151~154. When the selection circuit S21 is enabled, one of the input/output circuits 151~154 is enabled. As a result, even through the selection circuit S21 connects the input/output line of one of the pipelined circuits 121~124 to all of the input/output circuits 151~154, the read or write data signal can be input/output through the enabled one of the input/output circuits 151~154.

In addition, in response to the selection control signal SEL3, the selection unit S3, that is, the selection circuit S3, connects an input/output line of one of the pipelined circuits 121~128 to the input/output circuits 151~158. When the selection circuit S3 is enabled, one of the input/output circuits 151~158 is enabled. As a result, even though the selection circuit S3 connects the input/output line of one of the pipelined circuits 121~128 to all of the input/output circuits 151~158, the read or write data signal can be input/output through the enabled one of the input/output circuits 151~158.

In response to input/output control signals CTL1~CTL8, the input/output circuits 151~158 are enabled or disabled. In other words, the input/output data width of semiconductor memory device 100 is set in accordance with numbers of the enabled input/output circuits.

For example, when all of the input/output circuits 151~158 are enabled, the input/output width of semiconductor memory device 100 is set to ×8. At this time, all of the first to third selection units S1~S3 are disabled, and the input/output circuits 151~158 receive/transmit the read or write data signals from/to the pipelined circuits 121~128 through the input/output lines 130.

Alternatively, when the input/output circuits 151, 153, 155, and 157 are enabled, the input/output data width of semiconductor memory device 100 is set to ×4. At this time, only the first selection unit S1 is enabled in response to the selection control signal SEL1, and the other selection units S2 and S3 are disabled.

The input/output circuits 151, 153, 155, and 157 receive/transmit the read or write data signals from/to four enabled ones of the pipelined circuits 121~128 through the first selection unit S1. Also, where the input/output circuits 152, 154, 156, and 158 are enabled, the input/output data width of semiconductor memory device 100 is also set to ×4.

Also alternatively, when the input/output circuits 151 and 155 are enabled, the input/output data width of semiconductor memory device 100 is set to ×2. At this time, only the second selection unit S2 is enabled in response to the selection control signal SEL2, and the other selection units S1 and S3 are disabled.

The input/output circuits 151 and 155 receive/transmit the read or write data signals from/to two enabled ones of the pipelined circuits 121~128 through the second selection unit S2. In addition, when the input/output circuits 152 and 156, or 153 and 157, or 154 and 158 are enabled, the input/output data width of semiconductor memory device 100 is also set to ×2.

Further alternatively, when one of the input/output circuits 151~158 is enabled, the input/output data width of semiconductor memory device 100 is set to ×1. At this time, only the third selection unit S3 is enabled, and the enabled input/output circuit receives/transmits the read or write data signals from/to an enabled one of the pipelined circuits 121~128 through the third selection unit S3.

Here, pipelined circuits connected to input/output lines (not shown) of memory cells to be read or write are enabled. In other words, the enabled pipelined circuits, that is, input/output paths can change in accordance with column address signals input during a read or write operation.

Figure 4:
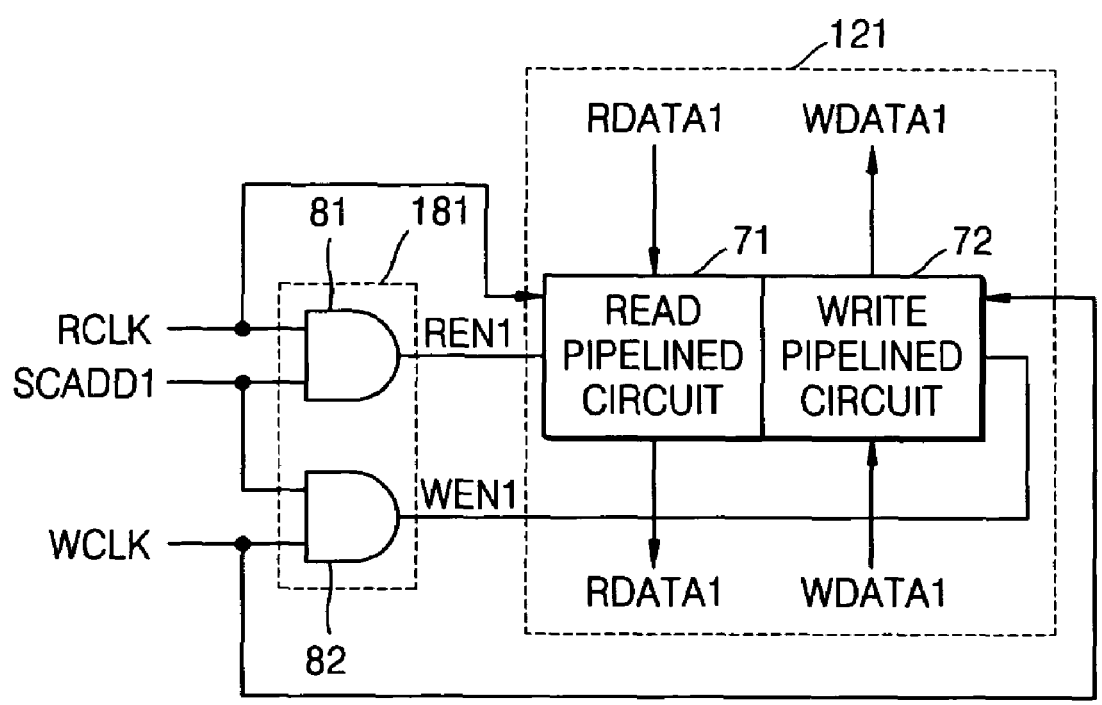
FIG. 4 is a detailed view of the logic circuit unit and pipelined circuit unit illustrated in FIG. 3.

Now, embodiments of the logical circuits 181~188 and the pipelined circuits 121~128 will be described in detail with reference to FIG. 4. Here, the logical circuits 181~188 have substantially the same structures and operations, and pipelined circuits 121~128 also have substantially the same structures and operations. Therefore, the description is mainly focused on the logical circuit 181 and the pipelined circuit 121.

The logical circuit 181 comprises AND gates 81 and 82. The AND gate 81 outputs a read pipeline enable signal REN1 in response to a read clock signal RCLK and a sub-column address signal SCADD1. The AND gate 82 outputs a write pipeline enable signal WEN1 in response to a write clock signal WCLK and the sub-column address signal SCADD1.

The pipelined circuit 121 comprises a read pipelined circuit element 71 and a write pipelined circuit element 72. The read pipelined circuit element 71 is enabled or disabled in response to the read pipeline enable signal REN1. When enabled, the read pipelined circuit element 71 stores a read data signal RDATA1 received from a memory cell core 110, and outputs the read data signal RDATA1 in response to the read clock signal RCLK. In addition, the write pipelined circuit element 72 is enabled or disabled in response to the write pipeline enable signal WEN1. When enabled, the write pipelined circuit element 72 receives and stores a write data signal WDATA1, and outputs the write data signal WDATA1 to the memory cell core 110 in response to the write clock signal WCLK.

Figure 5:
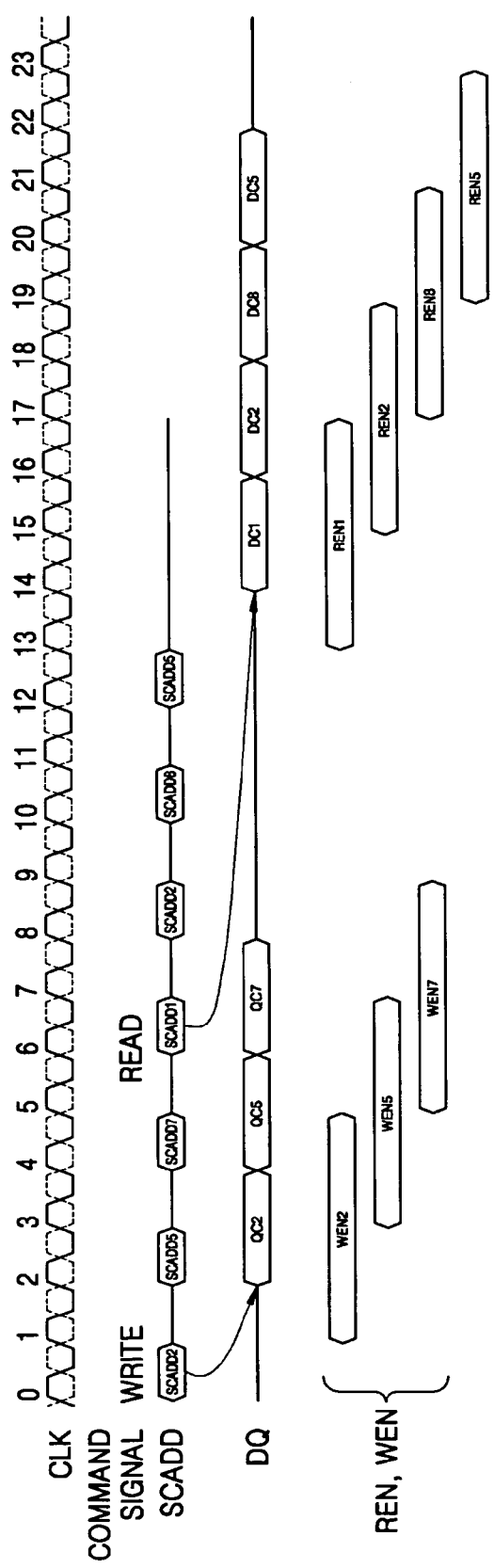
FIG. 5 is a timing diagram of primary signals associated with data input and output operations of a semiconductor memory device according to one or more aspects of the present invention.

Now, data input and output operations of the semiconductor memory device 100 will be described with reference to FIGS. 2 to 5. FIG. 5 is a timing diagram of primary signals associated with the data input and output operations of a semiconductor memory device according to one or more aspects of present invention. FIG. 5 illustrates an example of data input and output operations in a case where an input/output data width is ×1.

Firstly, the input/output data width of semiconductor memory device 100 is set. In other words, in response to a set input/output data width command received via the control signals /CS, /RAS, /CAS, and /WE and address signals A0~AU, a value of an input/output data width is set in a register (not shown) in the control unit 170. In FIG. 5, the input/output width of semiconductor memory device 100 is set to ×1.

Since the input/output data width is set to ×1, the control unit 170 enables one of the input/output control signals CTL1~CTLK. Herein, a case where the input/output control signal CTL1 is enabled is described. The control unit 170 outputs selection control signal SEL3 to enable the selection unit S3 (see FIG. 3) having a single output line. Referring to FIG. 3, only the input/output circuit 151 is enabled in response to the input/output control signal CTL1, and the other input/output circuits 152~158 are disabled.

Next, the control unit 170 detects an operation type of write and read operations in response to external control signals /CS, /RAS, /CAS, /WE and generates a command signal WRITE or READ in accordance with the operation type. FIG. 5 illustrates a case where the control unit 170 generate a write command signal WRITE and subsequently a read command signal READ.

The control unit 170 sequentially outputs sub-column address signals SCADD2, SCADD5, and SCADD7 in response to a column address signal externally received during the write operation. In addition, the control unit 170 outputs write clock signal WCLK.

Logic circuits 182, 185, and 187 of the logic circuit unit 180 sequentially enable write pipeline enable signals WEN2, WEN5, and WEN7 in response to the sub-column address signals SCADD2, SCADD5, and SCADD7 and the write clock signal WCLK. Enable intervals of the write pipeline enable signals WEN2, WEN5, and WEN7 are set longer than a setup-and-hold time of write data signals QC2, QC5, and QC7, respectively, as shown in FIG. 5. This allows the pipelined circuits 122, 125, and 127 to sufficiently receive the write data signals QC2, QC5, and QC7.

In response to the write pipeline enable signals WEN2, WEN5, and WEN7, write pipelined circuit elements of the pipelined circuits 122, 125, and 127 are sequentially enabled. When enabled, the pipelined circuit 122 stores write data signal QC2 received from the input/output circuit 151 and the selection unit S3. The pipelined circuit 122 outputs the write data signal QC2 to the memory cell core 110 in response to the write clock signal WCLK. After that, the pipelined circuits 125 and 127 are sequentially enabled. Similarly to the pipelined circuit 122, the pipelined circuits 125 and 127 also receive and store write data signals QC5 and QC7, and output the write data signals QC5, QC7 to the memory cell core 110 in response to the write clock signal WCLK.

Next, the control unit 170 sequentially outputs sub-column address signals SCADD1, SCADD2, SCADD8, and SCADD5 in response to a column address signal externally received during the read operation. In addition, the control unit 170 outputs a read clock signal RCLK.

Logical circuits 181, 182, 188, and 185 of the logic circuit unit 180 sequentially enable read pipeline enable signals REN1, REN2, REN8, and REN5 in response to the sub-column address signals SCADD1, SCADD2, SCADD8, and SCADD5 and the read clock signal RCLK. Enable intervals of the read pipeline enable signals REN1, REN2, REN8, REN5 are set longer than a setup-and-hold time of read data signals DC1, DC2, DC8, and DC5, respectively, as shown in FIG. 5. This allows the pipelined circuits 121, 122, 128, and 125 to sufficiently output the read data signals DC1, DC2, DC8, and DC5.

In response to the read pipeline enable signals REN1, REN2, REN8, and REN5, read pipelined circuits of the pipelined circuits 121, 122, 128, and 125 are sequentially enabled. When sequentially enabled, the pipelined circuits 121, 122, 128, and 125 store the read data signals DC1, DC2, DC8, and DC5 sequentially received from the memory cell core 110. In response to the read clock signal RCLK, the pipelined circuits 121, 122, 128, 125 sequentially output the read data signals DC1, DC2, DC8, and DC5 through the selection unit S3 and the input/output circuit 151.

In the above description of the input/output operations, the input/output data width of the semiconductor memory device 100 is set ×1. However, the input/output data width of semiconductor memory device 100 can change within an available maximum of the input/output data width as need.

Figure 6:
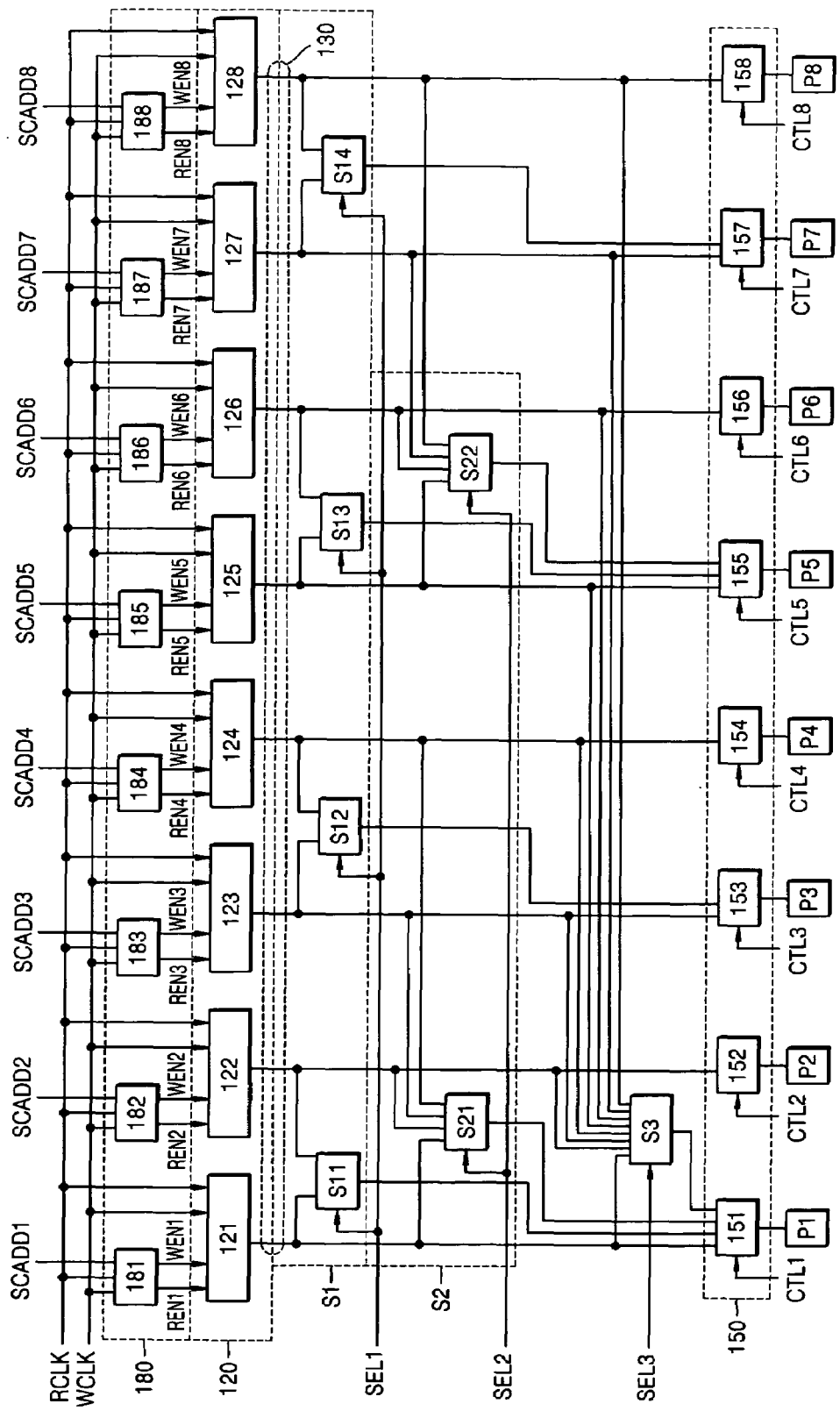
FIG. 6 is a view illustrating another example of a logic circuit unit, a pipelined circuit unit, first to N-th selection units, and a data input/output circuit unit illustrated in FIG. 2.

FIG. 6 is a view illustrating another example of a logic circuit unit 180, a pipelined circuit unit 120, first to N-th selection units S1~SN, and a data input/output circuit unit 150 illustrated in FIG. 2. FIG. 6 illustrates an example where the semiconductor memory device 100 has a maximum input/output data width of ×8 and comprises a first to third selection units S1~S3. The logic circuit unit 180, the pipelined circuit unit 120, the first to third selection units S1~S3, and the data input/output circuit unit 150 of FIG. 6 have substantially the same structures and operations as those of FIG. 3, and their descriptions are omitted except to note any differences.

A difference between the embodiments of FIGS. 3 and 6 is a connection between the first to third selection units S1~S3 and the data input/output circuit unit 150.

In response to the selection control signal SEL1, each of the selection circuits S11~S14 of the first selection unit S1 connects an input/output line of one of two pipelined circuits to one input/output circuit. For example, in response to the selection control signal SEL1, the selection circuit S11 connects an input/output line of one of the pipelined circuits 121 and 122 to the input/output circuit 151 of the data input/output circuit unit 150. When the first selection unit S1 is operated, the input/output circuits 151, 153, 155, and 157 of the data input/output circuit unit 150 are enabled, and other input/output circuits 152, 154, 156, and 158 are disabled. As a result, a read or write data signal is input/output through the input/output circuits 151, 153, 155, and 157. Alternatively, the selection circuits S11~S14 may be connected to the input/output circuits 152, 154, 156, and 158. In this case, when the first selection unit S1 is operated, the input/output circuits 152, 154, 156, and 158 are enabled, and other input/output circuits 151, 153, 155, and 157 are disabled.

In response to the selection control signal SEL2, each of the selection circuits S21~S22 of the second selection unit S2 connects an input/output line of one of four pipelined circuits to one input/output circuit. For example, in response to the selection control signal SEL2, the selection circuit S21 connects an input/output line of one of the pipelined circuits 121 and 124 to the input/output circuit 151 of the data input/output circuit unit 150. When the second selection unit S2 is operated, the input/output circuits 151 and 155 are enabled, and other input/output circuits 152~154, and 156~158 are disabled. As a result, a read or write data signal is input/output through the input/output circuits 151 and 155. Alternatively, the selection circuit S21 may be connected to one of the input/output circuits 152~154. In addition, the selection circuit S22 may be connected to one of the input/output circuits 156~158. In this case, when the second selection unit S2 is operated, the input/output circuits connected to the selection circuits S21 and S22 are enabled, and other input/output circuits are disabled.

In response to the selection control signal SEL3, the third selection unit S3, that is, the selection unit S3, connects an input/output line of one of eight pipelined circuits to one input/output circuit. For example, in response to the selection control signal SEL3, the selection circuit S3 connects an input/output line of one of the pipelined circuits 121~128 to the input/output circuit 151. When the selection circuit S3 is operated, the input/output circuit 151 is enabled, and other input/output circuits 152~158 are disabled. As a result, a read or write data signal is input/output through the input/output circuit 151. Alternatively, the selection circuit S3 may be connected to one of the input/output circuits 152~158. In this case, when the selection circuits S3 is operated, only the input/output circuit connected to the selection circuit S3 is enabled, and other input/output circuits are disabled.

As described above, since pipelined circuits connected to input/output lines of memory cells to be read or written are enabled based on a set input/output data width, it is possible to increase data input/output rate in a semiconductor memory device.

In addition, since only pipelined circuits corresponding to memory cells to be read or written are enabled and other pipelined circuits are disabled, it is possible to reduce power consumption due to pipelined circuits in a semiconductor memory device.

In addition, it is possible to selectively operate a plurality of input/output circuits based on a set input/output data width in a semiconductor memory device.

As described above, it is possible to selectively change an input/output data width, as needed, and selectively operate a pipelined circuit based on a set input/output data width in a semiconductor memory device.

As described above, it is possible to selectively operate an input/output circuit based on a set input/output data width in a semiconductor memory device.

As described above, it is possible to reduce power consumption of a pipelined circuit and increase a date input/output speed in a semiconductor memory device.

While the present invention has been particularly shown and described with reference to exemplary embodiments thereof, it will be understood by those skilled in the art that various changes in form and details may be made therein without departing from the spirit and scope of the invention as defined by the appended claims. The exemplary embodiments should be considered in descriptive sense only and not for purposes of limitation. Therefore, the scope of the invention is defined not by the detailed description of the invention but by the appended claims, and all differences within the scope will be construed as being included in the present invention.

What is claimed is:

1. A synchronous semiconductor memory device comprising:
    a plurality of input/output connections;
    a memory cell core having a plurality of memory cells;
    a data input/output circuit unit adapted to set an input/output data width in response to input/output control signals and adapted to input/output data signals through at least some of the plurality of input/output connections;
    a pipelined circuit unit connected to the data input/output circuit unit through input/output lines and adapted to transmit the data signals between the memory cell core and the data input/output circuit unit in response to clock signals through an input/output path selected in response to pipeline enable signals; and
    a plurality of selection units connected to the input/output lines through external common data lines and adapted to connect some of the input/output lines to the data input/output circuit unit in response to selection control signals.

2. The synchronous semiconductor memory device of claim 1,
    wherein the plurality of selection units are adapted to be selectively enabled and disabled in response to the selection control signals,
    wherein when one of the selection units is enabled, the other selection units are disabled, and
    wherein an input/output path of the pipelined circuit unit is adapted to change in accordance with the pipeline enable signals.

3. The synchronous semiconductor memory device according to claim 1, wherein the pipelined circuit unit is adapted to receive/transmit the data signals from/to the data input/output circuit unit through all of the input/output lines when the input/output data width of the data input/output circuit unit is set to a maximum value.

4. The synchronous semiconductor memory device according to claim 1, further comprising a control signal generation unit adapted to output the input/output control signals, the pipeline enable signals, the clock signals and the selection control signals in response to external control signals and address signals.

5. The synchronous semiconductor memory device according to claim 4,
    wherein the control signal generation unit is adapted to enable one or more of the pipeline enable signals in response to a set input/output data width command and column address signals of the address signals, and
    wherein enabled intervals of the pipeline enable signals are set longer than a setup-and-hold time of data signals.

6. The synchronous semiconductor memory device according to claim 4, wherein the control signal generation unit comprises:
    a control unit adapted to output the input/output control signals, the selection control signals, the clock signals, and sub-column address signals in response to the external control signals and the address signals; and
    a logic circuit unit adapted to output the pipeline enable signals in response to clock signals and the sub-column address signals.

7. The synchronous semiconductor memory device according to claim 6,
    wherein the clock signals comprise a read clock signal and a write clock signal, and
    wherein the logic circuit unit comprises:
        first logic circuits adapted to output read pipeline enable signals of the pipeline enable signals in response to the read clock signal and the sub-column address signals; and
        second logic circuits adapted to output write pipeline enable signals of the pipeline enable signals in response to the write clock signal and the sub-column address signals.

8. The synchronous semiconductor memory device according to claim 7,
    wherein the pipelined circuit unit comprises a plurality of pipelined circuits selectively enabled and disabled in response to the pipeline enable signals, and
    wherein some of the pipelined circuits are enabled and other pipelined circuits are disabled in response to the pipeline enable signals.

9. The synchronous semiconductor memory device according to claim 8,
    wherein a number of the enabled pipelined circuits of the plurality of pipelined circuits is equal to a value of the set input/output data width, and
    wherein the enabled pipelined circuits are changed in accordance with the sub-column address signals.

10. The synchronous semiconductor memory device according to claim 8, wherein the plurality of pipelined circuits comprises:
    read pipelined circuits adapted to be enabled and disabled in response to the read pipeline enable signals, wherein when the read pipelined circuits are enabled, they store read data signals received from the memory cell core and output the read data signals in synchronization with the read clock signal; and
    write pipelined circuits adapted to be enabled and disabled in response to the write pipeline enable signals, wherein when the write pipelined circuits are enabled, they store write data signals of the data signals received from the data input/output circuit unit and output the write data signals to the memory cell core in synchronization with the write clock signal.

11. The synchronous semiconductor memory device according to claim 8,
    wherein the data input/output circuit unit comprises a plurality of input/output circuits adapted to be enabled and disabled in response to the input/output control signals, and
    wherein at least two of the plurality of selection units comprise different numbers of selection circuits connected to input/output lines of the pipelined circuit unit.

12. The synchronous semiconductor memory device according to claim 11,
    wherein a number of enabled input/output circuits of the plurality of input/output circuits is equal to a value of the set input/output data width,
    wherein each of the selection circuits of one of the selection units connects an input/output line of one of the enabled pipelined circuits to one of the enabled input/output circuits in response to one of the selection control signals.

13. The synchronous semiconductor memory device according to claim 11,
    wherein a number of enabled input/output circuits of the plurality of input/output circuits is equal to a value of the set input/output data width,
    wherein each of the selection circuits of one of the selection units connects an input/output line of one of the enabled pipelined circuits to a set number of the input/output circuits in response to one of the selection control signals, wherein one of the set number of input/output circuits is enabled in response to the input/output control signals.

14. The synchronous semiconductor memory device according to claim 11, wherein at least one of the selection circuits connects an input/output line of an enabled one of the plurality of pipelined circuits to all of the input/output circuits, and wherein one of the plurality of input/output circuits is enabled in response to the input/output control signals.

15. The synchronous semiconductor memory device according to claim 11, wherein at least one of the selection circuits connects an input/output line of an enabled one of the plurality of pipelined circuits to one of the input/output circuits, and wherein the input/output circuit connected by the selection circuit to the enabled one of the plurality of pipelined circuits, is enabled in response to the input/output control signals.

16. The synchronous semiconductor memory device according to claim 6, wherein the plurality of selection units have different numbers of output signals, and wherein in response to the selection control signals, a selection unit comprising output signals corresponding to the set input/output data width of the data input/output circuit unit is enabled and other selection units are disabled.

17. The synchronous semiconductor memory device according to claim 6, wherein all the selection units are disabled when the input/output data width of the data input/output circuit unit is set to a maximum value.

18. A memory device, comprising:

a memory cell core adapted to store data;

a plurality of input/output connections adapted to communicate the data to and from the memory device;

a pipelined circuit unit adapted to communicate the data to/from the memory cell core in response to pipeline enable signals; and a plurality of selection units each adapted to selectively communicate the data between the pipelined circuit unit and selected ones of the plurality of input/output connections in response to selection control signals, wherein a number of the selected ones of the plurality of input/output connections equals an input/output data width of the memory device.

19. The memory device of claim 18, further comprising a data input/output circuit unit adapted to selectively communicate the data between the plurality of selection units and the plurality of input/output connections, and also to selectively communicate the data between the plurality of input/output connections and pipelined circuit unit without passing through any of the selection units.

20. The memory device of claim 18, wherein the plurality of selection units are adapted to be selectively enabled and disabled in response to the selection control signals, wherein when one of the selection units is enabled, the other selection units are disabled.

* * * * *